(12) United States Patent
Liu et al.

(10) Patent No.: US 7,029,923 B2
(45) Date of Patent: Apr. 18, 2006

(54) METHOD FOR MANUFACTURE OF MAGNETO-RESISTIVE BIT STRUCTURE

(75) Inventors: Harry Liu, Plymouth, MN (US); William Larson, Eden Prairie, MN (US); Lonny Berg, Elk River, MN (US); Theodore Zhu, Maple Grove, MN (US); Shaoping Li, Plymouth, MN (US); Romney R. Katti, Maple Grove, MN (US); Yong Lu, Plymouth, MN (US); Anthony Arrott, Washington, DC (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 10/734,663

(22) Filed: Dec. 11, 2003

(65) Prior Publication Data

US 2004/0126709 A1    Jul. 1, 2004

Related U.S. Application Data

(62) Division of application No. 09/999,684, filed on Oct. 30, 2001, now Pat. No. 6,717,194.

(51) Int. Cl.
 *H01L 21/00* (2006.01)
(52) U.S. Cl. .............. 438/3; 438/48; 257/295; 257/421; 365/158; 365/173

(58) Field of Classification Search ............. None
 See application file for complete search history.

(56) References Cited

U.S. PATENT DOCUMENTS

| | | | |
|---|---|---|---|
| 4,731,757 A | 3/1988 | Daughton et al. | |
| 4,780,848 A | 10/1988 | Daughton et al. | |
| 4,897,288 A | 1/1990 | Jenson | |
| 5,496,759 A | 3/1996 | Yue et al. | |
| 5,569,617 A | 10/1996 | Yeh et al. | |
| 6,381,171 B1 | 4/2002 | Inomata et al. | |
| 6,487,110 B1 | 11/2002 | Nishimura et al. | |
| 6,555,858 B1 | 4/2003 | Jones et al. | |
| 6,623,987 B1 * | 9/2003 | Liu et al. ............ | 438/3 |
| 6,649,423 B1 * | 11/2003 | Anthony et al. ...... | 438/3 |

* cited by examiner

*Primary Examiner*—David Nelms
*Assistant Examiner*—Long Tran
(74) *Attorney, Agent, or Firm*—Knobbe, Martens, Olson & Bear, LLP

(57) ABSTRACT

A magnetic bit structure for a magneto-resistive memory is disclosed that has bit ends that are sufficiently large to accommodate a minimum size contact or via hole. By providing such an arrangement, the magnetic bit structure may be fabricated using conventional contact and/or via processing steps. As such, the cost of manufacturing the device may be reduced, and the overall achievable yield may be increased.

21 Claims, 6 Drawing Sheets

METHOD FOR MANUFACTURE OF MAGNETO-RESISTIVE BIT STRUCTURE

REFERENCE TO RELATED APPLICATION

This application is a divisional of U.S. patent application Ser. No. 09/999,684, filed Oct. 30, 2001 now U.S. Pat. No. 6,717,194.

FIELD OF THE INVENTION

The present invention relates to magneto-resistive memories, and more particularly to magneto-resistive bit structures and method of manufacture therefor.

BACKGROUND OF THE INVENTION

Magneto-resistive memories are non-volatile. That is, the data stored in the memory are maintained even if power is lost or otherwise interrupted. Typical magneto-resistive memories use variations in the magnetization direction of a thin film of ferromagnetic material to represent and to store a binary state. Each thin film of ferromagnetic material can be referred to as a magneto-resistive bit. During a write operation, the magnetization direction of a selected bit structure is set by passing an appropriate current near the selected bit structure, often using a word line and/or digital line and/or sense current. The current produces a magnetic field that sets the magnetization direction of at least one of the layers in the ferromagnetic film in a desired direction. The magnetization directions dictate the magneto-resistance of the film. During a subsequent read operation, the magneto-resistance of the film can be read by passing a sense current through the bit structure via a sense line or the like.

Some prior art magneto-resistive bit structures are shown and described in U.S. Pat. No. 4,731,757 to Daughton et al. and U.S. Pat. No. 4,780,848 to Daughton et al., both of which are assigned to the assignee of the present invention and both of which are incorporated herein by reference. Illustrative processes for forming such magnetic bit structures are shown and described in U.S. Pat. No. 5,569,617 to Yeh et al: and U.S. Pat. No. 5,496,759 to Yue et al., both of which are assigned to the assignee of the present invention, and both of which are incorporated herein by reference.

Such magneto-resistive memories are often conveniently provided on the surface of a monolithic integrated circuit to provide easy electrical interconnection between the bit structures and the memory operating circuitry on the monolithic integrated circuit. To provide a sense current through the bit structure, for example, the ends of the bit structure are typically connected to adjacent bit structures through a metal interconnect layer. The string of bit structures then forms a sense line, which is often controlled by operating circuitry located elsewhere on the monolithic integrated circuit.

For many magneto-resistive memories, it is desirable to reduce the size of the ferromagnetic thin film bit structures to achieve significant density of stored digital bits. Because of the desire to reduce the size of the bit structures, the width of the bit structures is often smaller than the minimum allowed width of the contact and/or vias that are used to form the connection to the bit structure. As a result, the contact or via holes typically overlap the lateral edges of the bit structure as shown in, for example, U.S. Pat. No. 4,731,757 to Daughton et al. and U.S. Pat. No. 4,780,848 to Daughton et al.

A limitation of such an approach is that conventional integrated circuit processes often cannot be used to form the contact and/or via holes to the bit structure. For example, in a conventional integrated circuit process, the contact and via holes are often formed by first providing a patterned photoresist layer over the integrated circuit. The patterned photoresist layer defines the location and size of the contact and/or via holes that are used to make contact to the bit structure. Once the photoresist layer is in place, an etching process is used to etch the contact or via holes down to the bit structure. As indicated above, however, the contact and/or via holes often overlap the edge of a bit structure. In some conventional etching processes, the solvents used to perform the etch may damage the edges of the bit structure.

Once the contact or via holes are etched, a conventional oxygen asher photoresist removal step would typically be used to remove the photoresist layer. However, because the contact and/or via holes overlap the edge of the bit structure, the oxygen asher photoresist removal step may oxidize the sidewalls of the ferromagnetic bit structure, and can significantly damage the edges of the bit structure.

Because of the potential damage to the bit structure, many magnetic memory processes do not use conventional etch and photoresist removal steps when forming the contacts and/or via holes to the magnetic bit structures. Instead, specialized process techniques are often incorporated into the manufacturing process. For example, and continuing with the above example, the oxygen asher photoresist removal step may be replaced with other process steps that are less likely to oxidize the side wall of the magnetic film material, such as using a "wet" photoresist removal strip. Other techniques may also be used include providing spacers adjacent the exposed edges of the bit structure in an attempt to protect the edges from subsequent process steps. While these specialized techniques may reduce the risk of oxidization of the bit edges, such processes often cause higher defect densities than conventional photoresist steps, and may have other negative effects on the operation of the magneto-resistive bit structures.

What would be desirable, therefore, is a magneto-resistive bit structure that does not require special processing steps when forming the contacts or via holes to the bit structure. More specifically, what would be desirable is a magneto-resistive bit structure that can be formed without directly exposing the bit edges of the bit structure to the etch and/or removal steps. This may allow more efficient and reliable back-end processing, which in turn, may reduce the defect density and increase the yield of the devices.

SUMMARY OF THE INVENTION

The present invention overcomes many of the disadvantages of the prior art by providing a magnetic bit structure that can be produced using conventional contact and or via processing steps. This is preferably accomplished by providing a magnetic bit structure that has bit ends that are sufficiently large to accommodate a minimum size contact or via hole. As such, the contact or via holes may remain inside of the bit edges, thereby protecting the edges of the bit from later process steps that would otherwise cause oxidation or damage the bit structure.

In one illustrative embodiment, the magneto-resistive bit of the present invention includes a first bit end with a first contact structure. The first bit end is preferably dimensioned to extend laterally around the perimeter of the first contact structure. This arrangement may allow the first contact structure to contact only the top surface of the magneto-resistive bit, while protecting the side walls of the bit. The magneto-resistive bit may also include a second bit end with a corresponding second contact structure. Like the first bit end, the second bit end is preferably dimensioned to extend laterally around the perimeter of the second contact structure.

To retain many of the magnetic properties of a narrow magneto-resistive bit, it is contemplated that the magneto-resistive bit may include an elongate central section having a width that is narrower than the width of the first and second bit ends. In this configuration, the data is preferably stored in the elongated central section, rather than in the first or second bit ends. Several performance advantages result. First, one and/or both bit ends are not subjected to current flow between the two contacts. By not subjecting the bit ends to fields from currents from the contacts, undesired switching of the bit ends is reduced. Second, because the current path for the bit is restricted to the region between the contacts, current does not flow near the bit ends. The net result is to reduce electrical bit resistance and to increase the figure-of-ment of the ratio of the magnetoresistive change-in-resistance to the bit resistance.

In an illustrative method of the present invention, the magneto-resistive bit is preferably formed on a relatively planar surface of an integrated circuit. The magneto-resistive bit is then formed to have a first bit end, a second bit end, and an elongated central section therebetween. The elongated central section preferably has a width that is less than the width of either the first or second bit ends. A dielectric layer is then deposited or otherwise formed at least adjacent the first and second bit ends. Thereafter, a portion of the first dielectric layer is selectively removed to form a hole through the dielectric layer down to each bit end. The holes preferably have a perimeter that is spaced laterally inward from the perimeter of the bit ends.

When selectively removing the dielectric layer, a photoresist layer may first be provided over the dielectric layer. Light may then be selectively applied to the photoresist layer, where the exposed areas are subsequently removed via a photoresist removal step. The exposed portions of the dielectric layer are then removed using an etching step to form the holes.

Preferably, a protective layer is provided adjacent the magneto-resistive bit before the dielectric layer is provided. The protective layer preferably performs two primary functions. First, the protective layer acts as an etch stop during the dielectric etching step that is used to form the contact or via holes. Second, the protective layer may help protect the magneto-resistive bit from solvents, oxygen or other potentially destructive materials or elements that are used during subsequent processing steps, such as the photoresist removal step. In a preferred embodiment, the holes are etched through the first dielectric layer down to the protective layer.

Once formed, the holes are preferably filled with a conductive material. The conductive material preferably is a metal interconnect layer which is commonly used in conventional integrated circuit processes. The result is a contact or via structure that extends from the top of the dielectric layer down to the protective layer on the bit structure. The contact or via structures may then be used to electrically connect the bit structure to other components or elements of the magneto-resistive memory as required.

DETAILED DESCRIPTION OF THE PREFERRED EMBODIMENT

Figure 1:
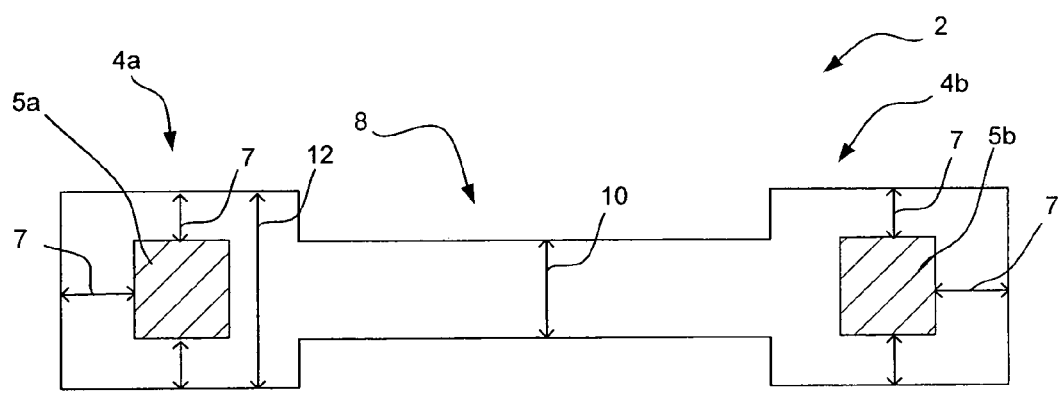
FIG. 1 is a top view of one illustrative embodiment of the present invention.

FIG. 1 is a top view of an illustrative embodiment of the present invention. The magnetic bit structure is generally shown at 2, and includes a first bit end 4a, a second bit end 4b, and an elongated central section 8. The first bit end 4a and the second bit end 4b are shown having a square or rectangular shape, but other shapes are contemplated including circular shaped, oval shaped, etc. The first bit end 4a and the second bit end 4b are preferably sufficiently large to accommodate a minimum size contact or via, such as contact or via 5a and contact or via 5b as shown. That is, the first bit end 4a and the second bit end 4b are preferably dimensioned to extend laterally around the perimeter of contact or via 5a and contact or via 5b, respectively. As such, the contact or via holes 5a and 5b are spaced inward from the bit edges, as shown at 7. This protects the edges of the bit from later processing steps that could cause oxidation or otherwise damage the bit structure 2.

To retain many of the magnetic properties of a narrow magneto-resistive bit, it is contemplated that the elongate central section 8 may have a width 10 that is narrower than the width 12 of the first bit end 4a and second bit end 4b. In this configuration, the data is preferably stored in the elongated central section 8, rather than in the first bit end 4a or the second bit end 4b. It has been found, however, that the magnetic properties of the elongated central section 8 may be improved relative to a pointed or tapered end configuration of, for example, U.S. Pat. No. 4,731,757 to Daughton et al., by providing the larger bit ends 4a and 4b.

Figure 2:
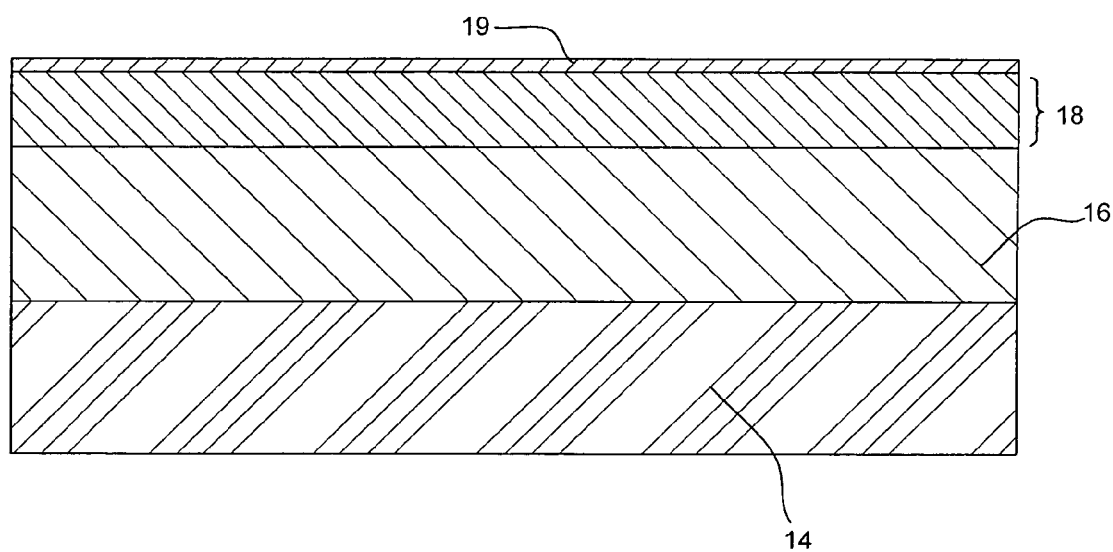
FIG. 2 is a cross-sectional side view of an illustrative integrated circuit having ferromagnetic layers formed thereon.

FIGS. 2–5 show an illustrative method for forming the bit structure of FIG. 1. FIG. 2 is a cross-sectional side view of an illustrative integrated circuit having ferromagnetic layers formed thereon. The integrated circuit 14 is preferably formed using a conventional integrated circuit front-end process and may include various devices or components including transistors, capacitors, metal interconnect layers, etc. Illustrative conventional integrated circuit processes may include CMOS, Bipolar, BICMOS, GaAs, etc. Preferably, word lines are formed using one of the metal interconnect layers of the integrated circuit 14. The word lines are preferably provided directly below each bit structure.

The integrated circuit 14 is preferably covered with an insulating layer 16, such as silicon nitride (SiN). The top surface of the insulating layer 16 is then preferably planarized. This can be accomplished by using a conventional Chemical Mechanical Polishing (CMP) process, or any other planarizing method. Once planarized, a magneto-resistive stack 18 is formed. The magneto-resistive stack 18 may be formed in accordance with, for example, U.S. Pat. No. 5,496,759 to Yue et al. Once the magneto-resistive stack 18 is formed, a cap or protective layer 19 is provided. The protective layer 19 is preferably chromium silicon (CrSi), which is partially conductive and acts as an etch stop for subsequent etching steps that are further described below. The protective layer 19 also preferably protects the magneto-resistive stack 18 from damage from subsequent processing steps, such as an oxygen asher photoresist removal step, as further described below. The protective layer 19 should be at least partially conductive because a metal contact will engage or contact the protective layer 19 from above. This metal contact will not directly contact the magneto-resistive stack 18, but rather must pass current, such as a sense current, through the protective layer 19 to the magneto-resistive stack 18 to form a connection.

Figure 6:
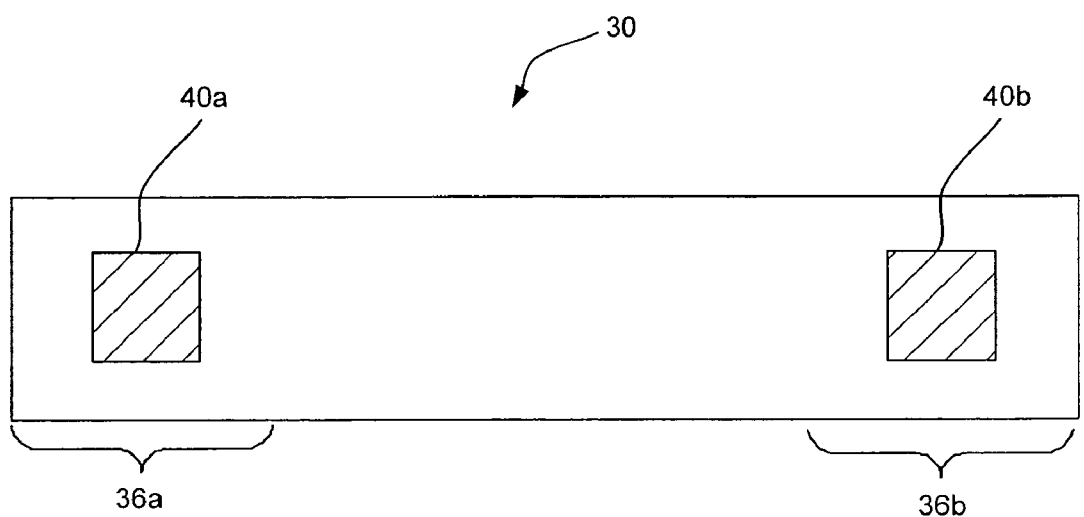
FIG. 6 is a top view of another illustrative embodiment of the present invention.

Next, the magneto-resistive stack 18 is cut into a desired shape, such as the shape shown in FIG. 1 or FIG. 6. This is preferably accomplished by providing a patterned layer above the portion of the magneto-resistive stack 18 that is to be retained. Suitable processes for cutting the magneto-resistive stack 18 are described in, for example, U.S. Pat. No. 5,496,759 to Yue et al. and U.S. Pat. No. 5,569,617 to Yeh et al., which teach an ion milling process. However, it is contemplated that other suitable etch processes may be used to shape the bit.

Figure 3:
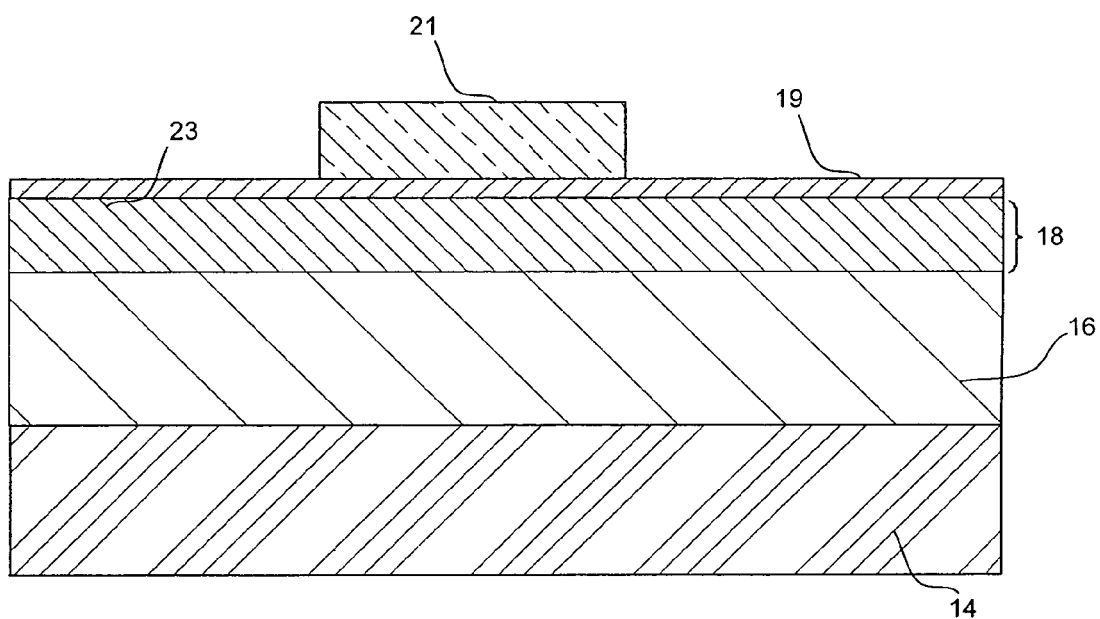
FIG. 3 is a cross-sectional side view of the illustrative integrated circuit of FIG. 2 with an ion mill mask positioned over the ferromagnetic layers.

In FIG. 3, an ion mill mask 21 with the same top profile as the desired bit shape is deposited over the magneto-resistive stack 18 to define and protect the bit structure that is to remain in area 23. The ion mill mask may be made from SiN or another suitable ion mill mask material such as bias sputtered quartz. Ion milling is then commenced to cut the magneto-resistive stack 18 to the desired bit shape, and the remaining magneto-resistive stack 18 is removed in all areas other than those underlying the ion mill mask 21. The ion mill mask is then removed through a suitable etch process. In an alternate method, an in-situ sputter etch process may be used, together with a suitable etch mask, to form the desired bit shape.

Figure 4:
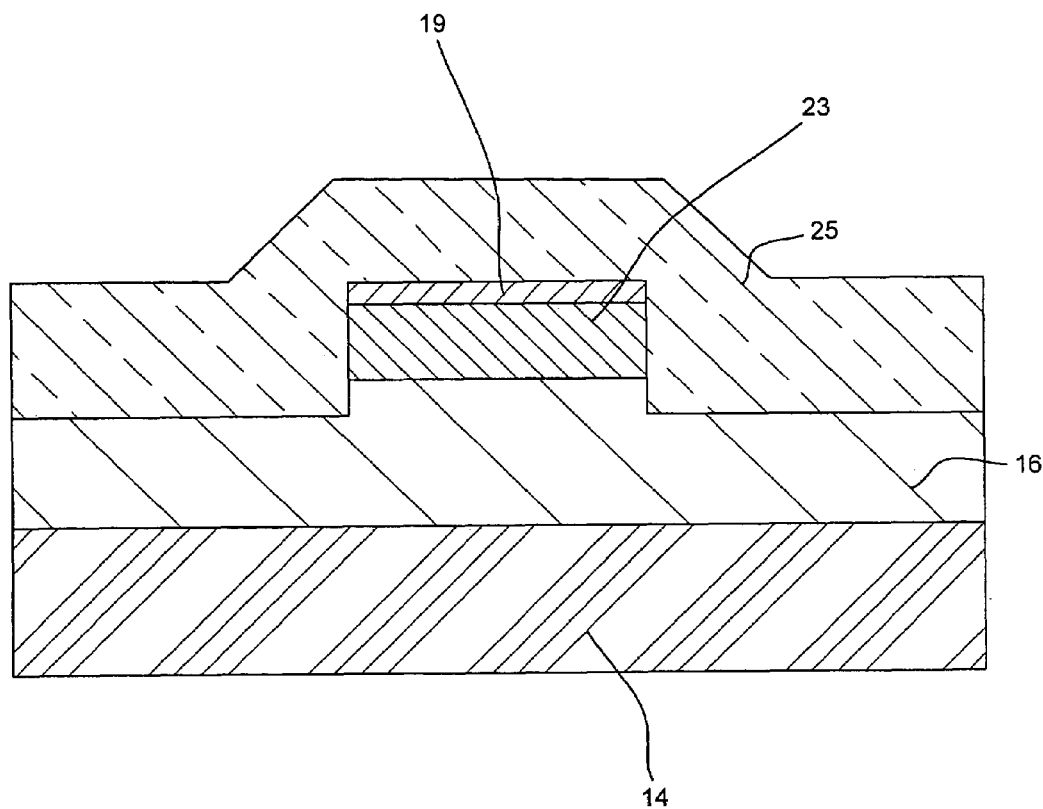
FIG. 4 is a cross-sectional side view of the illustrative integrated circuit of FIG. 3 after the magneto-resistive bit is patterned, and after an oxide layer has been provided over the top surface thereof.

FIG. 4 is a cross-sectional side view of the illustrative integrated circuit of FIG. 3 after the magneto-resistive bit is patterned, and after a passivation or insulating layer 25 has been provided over the top surface thereof. The passivation or insulating layer 25 is preferably deposited over the entire top surface of the integrated circuit. The passivation or insulating layer 25 helps prevent a metal interconnect layer that will be placed over the magneto-resistive bit from contacting the bit except in designated regions at which holes are made in the insulating layer 25. The insulating layer 25 may be, for example, SiN, bias sputtered quartz (BSQ), or any other suitable material.

Figure 5:
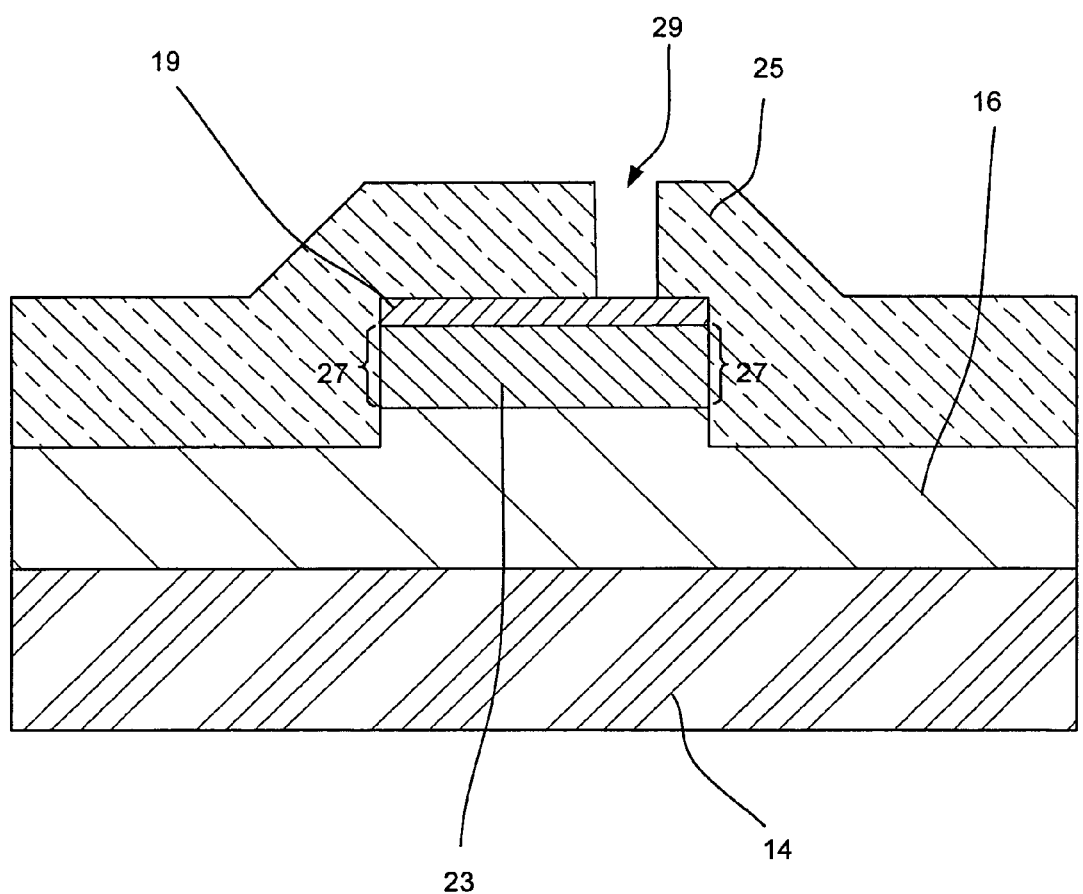
FIG. 5 is a cross-sectional side view of the illustrative integrated circuit of FIG. 4 with a contact or via hole cut through the oxide layer down to the magneto-resistive bit.

FIG. 5 is a cross-sectional side view of the illustrative integrated circuit of FIG. 4 with a contact or via hole 29 cut through the insulating layer 25 down to the magneto-resistive bit, or more preferably down to the protective layer 19. The contact or via hole 29 is preferably placed approximately in the center of one of the bit ends 4a and 4b (see FIG. 1) to establish an electrical connection to the bit. The contact or via hole 29 preferably does not extend down past the top of the protective layer 19, or outside the perimeter edges of the magneto-resistive bit, as shown for example in FIG. 1. The side edges 27 of the magneto-resistive bit are thus not exposed to later processing, but rather remain covered and protected by the insulating layer 25. Because the top surface of the magneto-resistive bit is protected by the protective layer 19, and because the side walls 27 of the magneto-resistive bit are protected by the insulating layer 25, the contact or via holes 29 may be created using conventional processing steps including, for example, an oxygen asher photoresist removal step. This may significantly reduce the cost of producing the magneto-resistive memory and may increase the overall yield that can be achieved.

After creation of the contact or via holes 29, a metal layer is preferably placed over the insulating layer 25 and etched to form a desired metal pattern. The metal preferably extends down into the contact or via hole 29, allowing the metal layer to fill contact or via hole 29 and contact the protective layer 19. Because the protective layer 19 is preferably at least partially conductive, an electrical connection is made between the metal layer and the magneto-resistive bit. Alternatively, it is contemplated that the contact or via hole 29 may first be filled with a low resistance material such as tungsten before providing the metal layer. This may reduce the overall resistance of the contact or via hole 29.

While the illustrative embodiment shown in FIG. 1 has an elongated central section 8 that is narrower than the bit ends 4a and 4b, other embodiments are also contemplated. One such alternative embodiment is shown in FIG. 6. In this illustrative embodiment, the elongated central section 30 has a width that is close to or equal to that of the bit ends 36a and 36b. The first bit end 36a and the second bit end 36b of FIG. 6 are still, however, preferably sufficiently large to accommodate a minimum size contact or via, such as contact or via 40a and contact or via 40b, as shown.

Having thus described the preferred embodiments of the present invention, those of skill in the art will readily appreciate that yet other embodiments may be made and used within the scope of the claims hereto attached. Numerous advantages of the invention covered by this document have been set forth in the foregoing description. It will be understood, however, that this disclosure is, in many respects, only illustrative. Changes may be made in details, particularly in matters of shape, size, and arrangement of parts without exceeding the scope of the invention.

We claim:

1. A method for forming an integrated circuit, comprising:
   forming a magneto-resistive bit having an elongated central section and a first bit end, the first bit end having a perimeter and a width, the elongated central section having a width, the width of the first bit end being greater than the width of the elongated central section;
   forming a dielectric layer adjacent to the first bit end; and
   selectively removing a portion of the dielectric layer to form a hole, the hole having a perimeter and extending down to the magneto-resistive bit structure, wherein the hole is dimensioned such that the perimeter of the hole is spaced laterally inward of a perimeter of the first bit end.

2. The method of claim 1, wherein the first dielectric layer comprises silicon nitride.

3. The method of claim 1, wherein selectively removing comprises removing the portion of the dielectric layer using a preferential etch.

4. The method of claim 1, wherein selectively removing comprises removing the portion of the dielectric layer using an anisotropic etch.

5. The method of claim 1, wherein selectively removing comprises removing the portion of the dielectric layer using ion milling.

6. The method of claim 1, wherein selectively removing comprises removing the portion of the dielectric layer using plasma etching.

7. The method of claim 1, wherein selectively removing comprises:
providing a photoresist over the dielectric layer;
selectively applying light to areas where the dielectric layer is to be removed;
removing the photoresist to expose the portion of the dielectric layer that is to be removed; and
removing the exposed portion of the dielectric layer to form the hole.

8. The method of claim 7, wherein removing the photoresist is accomplished using an oxygen asher photoresist strip.

9. The method of claim 7, wherein selectively applying light is performed using electron beam photolithography.

10. The method of claim 7, wherein selectively applying light includes applying ultraviolet (UV) light.

11. The method of claim 1, further comprising:
forming a protective layer at least adjacent to the first bit end, prior to formation of the dielectric layer.

12. The method of claim 11, wherein selectively removing comprises removing the dielectric layer to form the hole through the first dielectric layer, the hole extending down to the protective layer.

13. The method of claim 11, wherein the protective layer is at least partially conductive.

14. The method of claim 11, wherein the protective layer comprises chrome-silicon.

15. The method of claim 1, wherein forming a magneto-resistive bit comprises forming a second bit end at an opposite end of the magneto-resistive bit from the first bit end, wherein the second bit end has a perimeter and a width.

16. The method of claim 15, wherein the width of the second bit end is greater than the width of the elongated central section.

17. The method of claim 15, wherein selectively removing comprises forming a second hole over the second bit end, wherein a perimeter of the second hole is spaced laterally inward of the perimeter of the second bit end.

18. The method of claim 17, further comprising filling the second hole with one or more conductive materials, wherein filling the second hole forms a conductive contact with the second bit end.

19. The method of claim 1, further comprising depositing a metal layer over the dielectric layer to at least partially fill the hole with metal.

20. The method of claim 1, further comprising filling the hole with a low resistance material and then depositing a metal layer over the dielectric layer.

21. The method of claim 20, wherein the low resistance material is tungsten.

* * * * *